US007873883B2

(12) United States Patent
Browne et al.

(10) Patent No.: US 7,873,883 B2
(45) Date of Patent: Jan. 18, 2011

(54) METHOD FOR SCRUBBING STORAGE IN A COMPUTER MEMORY

(75) Inventors: Michael E. Browne, Staatsburg, NY (US); Trevor E. Carlson, Bethpage, NY (US); Stephanie A. Schaum, Poughkeepsie, NY (US); Ashwin S. Venkatraman, Poughkeepsie, NY (US); Maria R. Ward, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 11/959,727

(22) Filed: Dec. 19, 2007

(65) Prior Publication Data

US 2009/0164855 A1 Jun. 25, 2009

(51) Int. Cl.
*G11C 29/10* (2006.01)
*G11C 29/54* (2006.01)
(52) U.S. Cl. .......................................... 714/718; 714/42
(58) Field of Classification Search ........................ None
See application file for complete search history.

(56) References Cited

U.S. PATENT DOCUMENTS

| 4,964,130 | A | 10/1990 | Bowden, III et al. |
| 5,263,032 | A | 11/1993 | Porter et al. |
| 6,216,169 | B1 | 4/2001 | Booman et al. |
| 6,279,128 | B1 | 8/2001 | Arnold et al. |
| 6,480,982 | B1 | 11/2002 | Chan et al. |
| 6,560,725 | B1 | 5/2003 | Longwell et al. |
| 6,762,611 | B2 * | 7/2004 | Hubner et al. .............. 324/754 |
| 7,058,782 | B2 | 6/2006 | Henderson et al. |
| 7,100,004 | B2 | 8/2006 | Chen Johnson et al. |
| 2003/0097608 | A1 | 5/2003 | Rodeheffer et al. |
| 2003/0135794 | A1 | 7/2003 | Longwell et al. |
| 2006/0212778 | A1 | 9/2006 | Wheeler et al. |
| 2007/0022244 | A1 | 1/2007 | Kimmery |
| 2007/0050667 | A1 | 3/2007 | Zohar et al. |
| 2007/0101238 | A1 | 5/2007 | Resnick et al. |
| 2008/0022186 | A1 * | 1/2008 | Co et al. ..................... 714/763 |
| 2008/0301530 | A1 | 12/2008 | Spanel et al. |
| 2009/0125788 | A1 | 5/2009 | Wheeler et al. |

* cited by examiner

*Primary Examiner*—Cynthia Britt
*Assistant Examiner*—Dipakkumar Gandhi
(74) *Attorney, Agent, or Firm*—Cantor Colburn LLP; Steven Chiu

(57) ABSTRACT

A method for scrubbing storage in a computer memory which includes a plurality of memory modules each having plurality of memory chips. The method includes selecting a pattern that correlates with physical structures for scanning the memory chips of the memory modules for errors, scanning a memory chip of a memory module for errors based upon the selected pattern. The method further includes successively scanning remaining memory chips of the respective memory module for errors when an error is found in the scanned memory chip, and scanning a memory chip of another memory module when an error is not found in the scanned memory chip of the respective memory module.

20 Claims, 4 Drawing Sheets

METHOD FOR SCRUBBING STORAGE IN A COMPUTER MEMORY

BACKGROUND OF THE INVENTION

1. Field of the Invention

This invention relates to a method for scrubbing storage in a computer memory, and particularly to a memory scrubbing method which enables the use of a pattern that correlates with physical structures to perform a memory scrubbing operation of a plurality of memory modules, in order to detect errors in the memory modules more quickly, and to perform testing or replacement thereof more efficiently.

2. Description of Background

In memory modules such as dual-in-line memory modules (DIMMs) used in portable electronic devices, for example, mobile phones and portable computers, memory data and keys are periodically scrubbed to correct soft errors, i.e., correctable errors (CEs) before they develop into hard errors, i.e., uncorrectable errors (UEs). Conventionally, each memory module is fully scrubbed in turn, sequentially, one at a time. Thus, this creates a problem in that when one of the memory chips of a memory module includes errors and the erroneous memory chip is located at a non-sequential memory location such that it would take a long time to sequentially scan to arrive to that memory address, the erroneous memory chip may not be found and corrected until the entire memory subsystem has been scrubbed.

SUMMARY OF THE INVENTION

The shortcomings of the prior art are overcome and additional advantages are provided through the provision of a method for scrubbing storage in a computer memory which includes a plurality of memory modules each having plurality of memory chips. The method includes selecting a pattern that correlates with physical structures for scanning the memory chips of the memory modules for errors and scanning a memory chip of a memory module for errors based upon the selected pattern. The method further includes successively scanning remaining memory chips of the respective memory module for errors when an error is found in the scanned memory chip, and scanning a memory chip of another memory module when an error is not found in the scanned memory chip of the respective memory module.

A computer program products corresponding to the above-summarized method is also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

Embodiments of the present invention create a method of changing a scrubbing algorithm of memory chips in a plurality of memory modules based on a pattern that correlates with physical structures in order to perform a memory scrubbing operation of the memory modules more efficiently.

As a result of the summarized invention, technically we have achieved a solution which enables localized correctable errors in memory chips to be found and repaired before they become uncorrectable errors.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
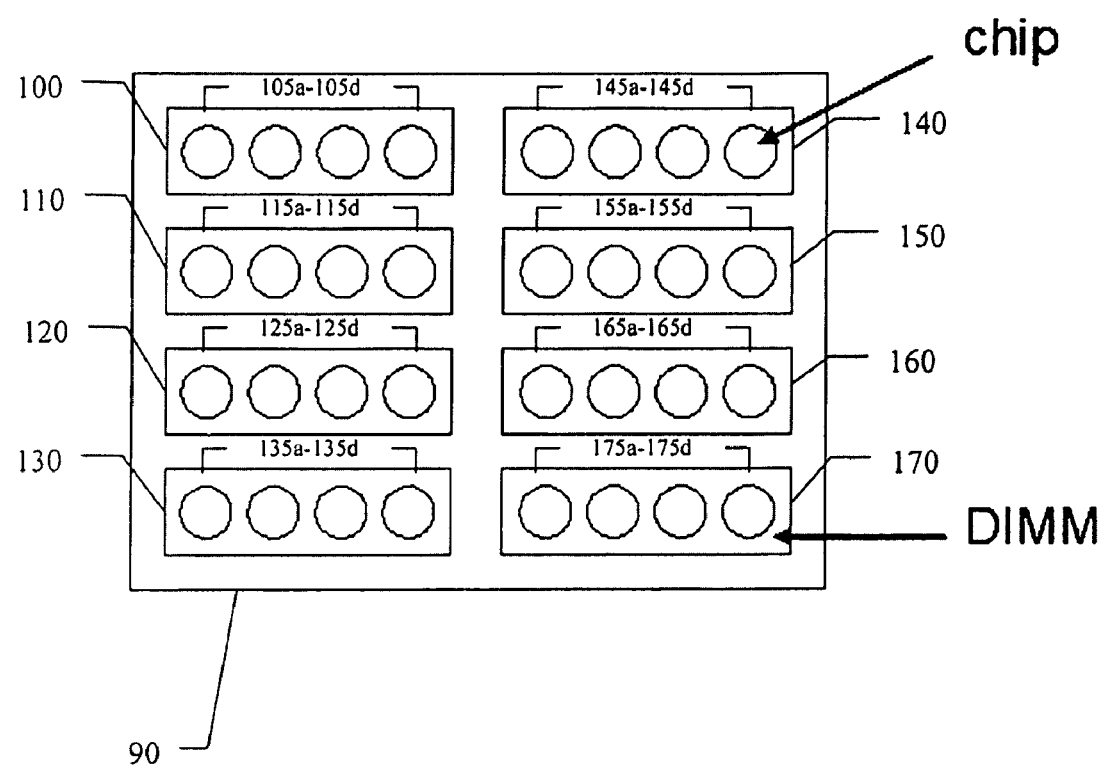
FIG. 1 illustrates a schematic diagram illustrating an example of a plurality of memory modules of a memory unit that can be implemented within embodiments of the present invention.

Turning now to the drawings in greater detail, it will be seen that in FIG. 1 there is a memory unit 90 of a computer, which comprises a plurality of dual in-line memory modules, DIMMs 100, 110, 120, 130, 140, 150, 160 and 170 arranged in two columns. Each DIMM respectively comprises a plurality of memory chips 105*a*-105*d*, 115*a*-115*d*, 125*a*-125*d*, 135*a*-135*d*, 145*a*-145*d*, 155*a*-155*d*, 165*a*-165*d* and 175*a*-175*d*. According to an exemplary embodiment, the present invention may be used in an electronic device such as a mobile phone or a portable computer, for example, and is not limited to any particular type of computer. Further, the present invention is not limited to a particular type of memory module, and may vary accordingly. In addition, the present invention is not limited to any particular number of memory modules or any particular number of memory chips per memory module, and may vary accordingly.

Figure 2:
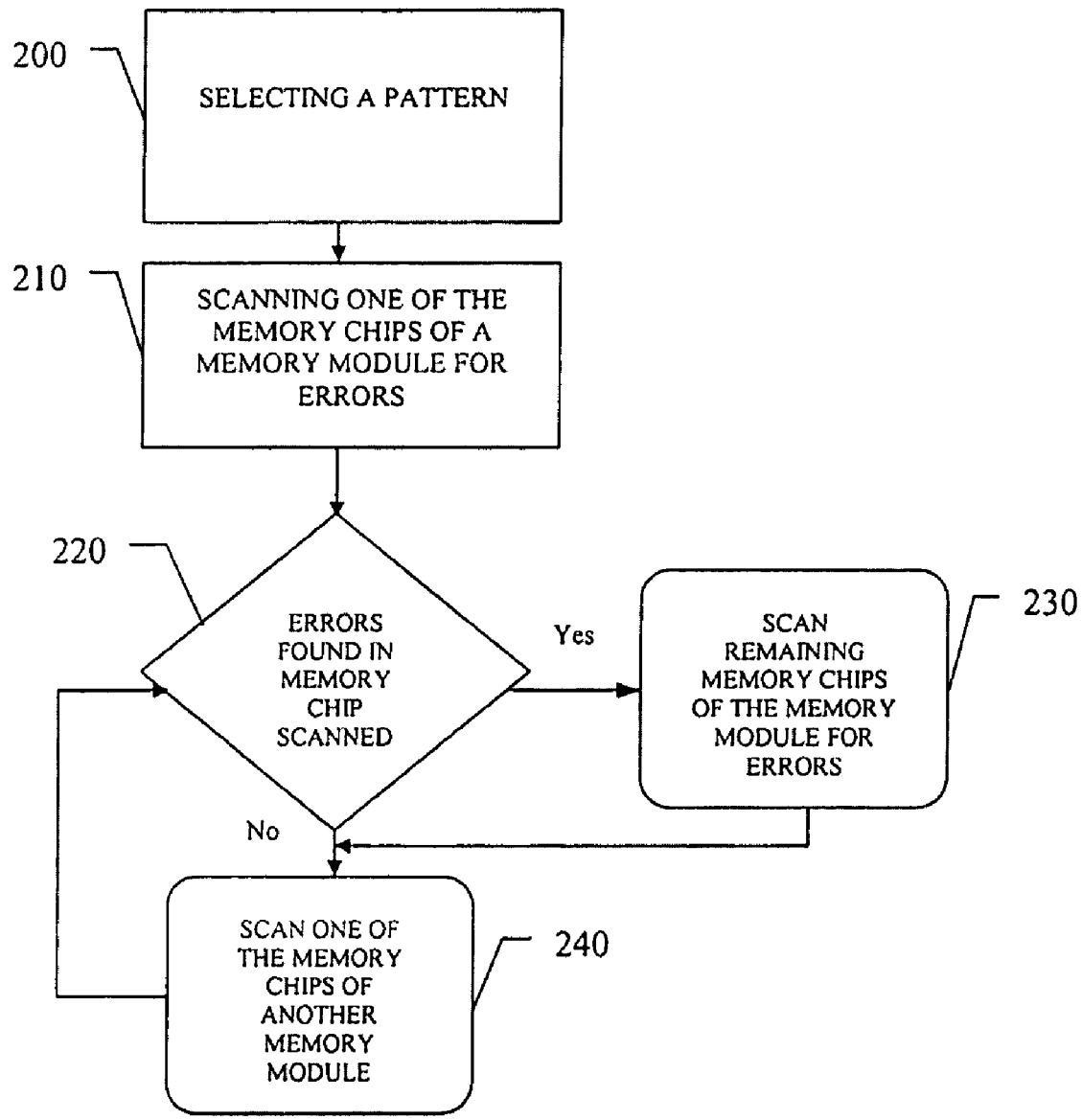
FIG. 2 illustrates a flow chart detailing aspects of a method for scrubbing storage in a computer memory that can be implemented within aspects of the present invention with reference to FIG. 1.

FIG. 2 illustrates a flow chart detailing aspects of a method for scrubbing storage in a computer memory that can be implemented within aspects of the present invention with reference to FIG. 1.

Figure 3:
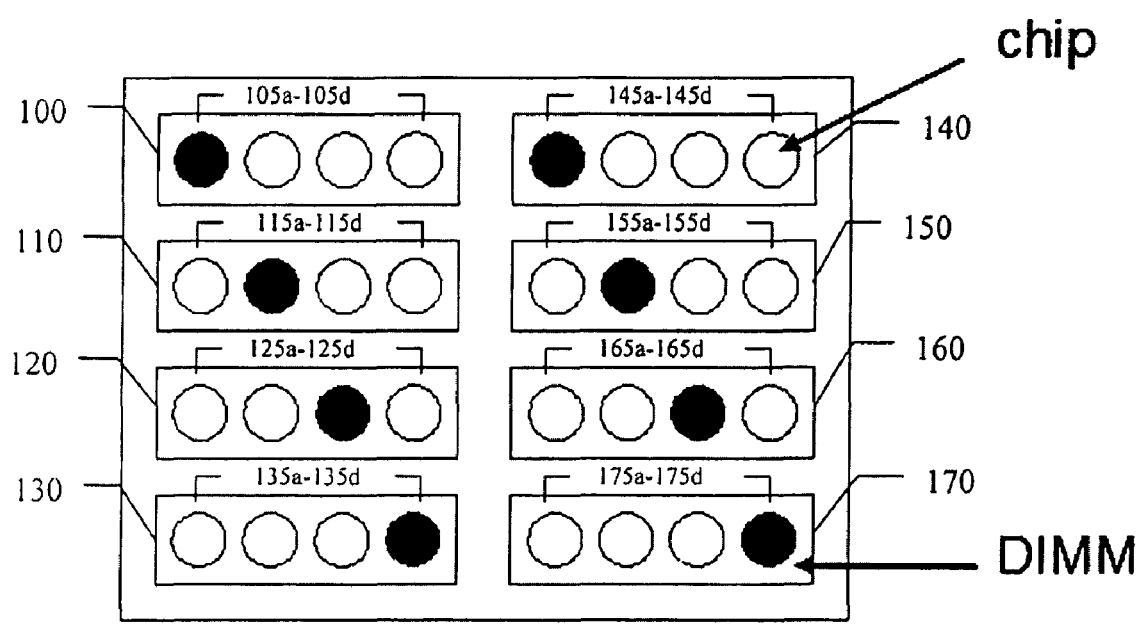
FIG. 3 illustrates a schematic diagram illustrating an example of a pattern that correlates with physical structures for scanning memory modules that can be implemented within embodiments of the present invention.
Figure 4:
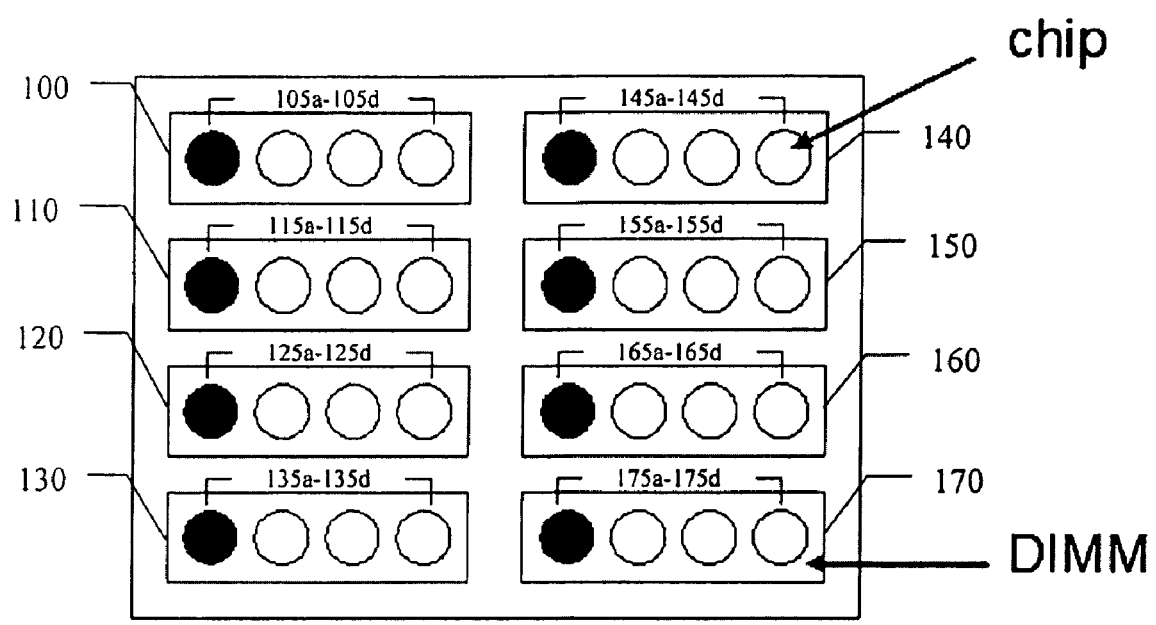
FIG. 4 illustrates a schematic diagram illustrating another example of a pattern that correlates with physical structures for scanning memory modules that can be implemented within embodiments of the present invention.

According to the current exemplary embodiment, in FIG. 2, at operation 200, a pattern that correlates with physical structures (as shown in FIGS. 3 and 4, for example) is selected for scanning the memory chips 105*a*-175*d* of the memory modules, DIMMS 100-170 shown in FIG. 1 for errors. From operation 200, the process moves to operation 210 where one of the memory chips 105*a*-105*d* of the memory module DIMM 100 is scanned for errors based upon the selected pattern. According to an exemplary embodiment of the present invention, at operation 210, the memory chip 105*a*-105*d* selected to be scanned, is selected and scanned for errors. That is, the memory chip selected may be one of the memory chips 105*b*-105*d* (at a non-linear location).

From operation 210, the process moves to operation 220 where it is determined whether errors are found in the scanned memory chip 105*a*-105*d*. When it is determined at operation 220 that an error is detected in the scanned memory chip 105*a*-105*d*, the process moves to operation 230 where the remaining memory chips 105*a*-105*d* are successively scanned for errors prior to scanning a memory chip of a next memory module for errors at operation 240. At operation 240, one of the memory chips 115a-115d of another memory module DIMM 110, for example, is scanned for errors.

On the other hand, when it is determined at operation 220 that the scanned memory chip 105a-105d does not include any errors, the process moves to operation 240 where one of the memory chips 115a-115d of memory module DIMM 110 is scanned for errors. The process then returns to operation 220 where it is determined whether errors are found in the scanned memory chip 115a-115d. According to an exemplary embodiment of the present invention, the above-method is performed for each of the memory modules DIMMS 100-170 shown in FIG. 1. Further, according to an exemplary embodiment, during a scanning operation of the memory modules DIMMS 100-170, each memory chip 105a-175d of each memory module DIMM 100-170 is scanned in a non-repetitive sequence. That is, each memory chip 105a-175d is scanned only once during a scanning operation of the memory modules.

According to an exemplary embodiment, a queue is created and a memory module DIMM 100-170 is placed in the queue to be scanned first, when an error is found at a memory chip 105a-175d of the respective memory module DIMM 100-170. For example if memory chip 125a of DIMM 120 includes an error, then DIMM 120 may be placed in queue to be scanned first during an next scanning operation.

In addition, according to an exemplary embodiment, diagnostic testing may be performed for a predetermined time period on the memory modules DIMMS 100-170 including errors, or the memory modules DIMMS 100-170 including errors may be replaced.

Examples of different types of patterns will now be described with reference to FIGS. 3 and 4. The present invention is not limited to the pattern being of a particular pattern, and may vary, accordingly.

FIG. 3 illustrates a schematic diagram illustrating an example of a pattern that correlates with physical structures for scanning memory modules that can be implemented within embodiments of the present invention, and FIG. 4 illustrates a schematic diagram illustrating another example of a pattern that correlates with physical structures for scanning memory modules that can be implemented within embodiments of the present invention. According to an exemplary embodiment, a pattern that correlates with physical structures may be a pattern which is determined based on whether or not errors are found in the scanned memory chip and/or a location of the scanned memory chip, for example.

As shown, FIG. 3 illustrates a pattern that correlates with physical structures in which the memory modules DIMMS 100-170 are scanned diagonally. For the purpose of illustration, the memory chips of each memory module to be scanned first, are shaded. In the current exemplary embodiment, memory chip 105a of DIMM 100 is first scanned, when an error is found in memory chip 105a, then the remaining memory chips 105b-105d of DIMM 100 are successively scanned. However, when no errors are found in memory chip 105a of DIMM 100, then memory chip 115b of DIMM 110 is scanned. If an error is found at memory chip 115b, then the remaining memory chips 115a, 115c and 115d of DIMM 110 are successively scanned, however, if no errors are found in memory chip 115b of DIMM 110, then memory chip 125c of DIMM 120 is scanned, and if no errors are found in memory chip 125c of DIMM 120, then memory chip 135d of DIMM 130 is scanned. This process is then performed for the remaining memory modules DIMMs 140-170 as shown in FIG. 3. According to the current exemplary embodiment, the memory modules DIMMs 100-170 are scanned in a nonlinear order. By scanning on a per chip basis, localized errors can be found more quickly.

FIG. 4 illustrates another pattern that correlates with physical structures in which the memory modules DIMMs 100-170 are scanned vertically. According to the current exemplary embodiment, in FIG. 4, the first memory chips 105a, 115a, 125a, 135a, 145a, 155a, 165a and 175a of each of the memory modules DIMMs 100-170 are to be scanned first of the memory chips for each memory module DIMM 100-170. For example, the first memory chip 105a of the memory module DIMM 100 is first scanned for errors. If an error is found in the first memory chip 105a, then the remaining memory chips 105b-105d of the respective memory module DIMM 100 are successively scanned. On the other hand, if no errors are found in the first memory chip 105a, then the first memory chip 115a of the next memory module DIMM 110 is scanned. The process is performed for all of the first memory chips 105a, 115a, 125a, 135a, 145a, 155a, 165a and 175a for each of the memory modules DIMMs 100-170. Further, according to an exemplary embodiment, the memory chips 105a-175d may be scanned up and down each column shown in FIG. 4. That is, if no errors are found in the first memory chips 105a, 115a, 125a, 135a, 145a, 155a, 165a and 175a, then the second memory chips 105b, 115b, 125b, 135b, 145b, 155b, 165b and 175b may be scanned for errors.

The present invention is not limited to the first memory chips 105a, 115a, 125a, 135a, 145a, 155a, 165a and 175a of each memory module DIMMs 100-170 being first scanned. According to another exemplary embodiment, all of the second memory chips 105b, 115b, 125b, 135b, 145b, 155b, 165b and 175b, third memory chips 105c, 115c, 125c, 135c, 145c, 155c, 165c and 175c or fourth memory chips 105d, 115d, 125d, 135d, 145d, 155d, 165d and 175d of the memory modules 100-170 may be first scanned.

According to an exemplary embodiment, the non-sequential memory location of a memory chip first scanned for each of the memory modules DIMMs 100-170 is the same for each memory module DIMM 100-170.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for scrubbing storage in a computer memory which comprises a plurality of memory modules each having a plurality of memory chips, the method comprising:
    selecting a pattern that correlates with physical structures for scanning the memory chips of the memory modules for errors;
    scanning a memory chip of a memory module for errors based upon the selected pattern; and
    successively scanning remaining memory chips of the respective memory module for errors when an error is found in the scanned memory chip, and scanning a memory chip of another memory module when an error is not found in the scanned memory chip of the respective memory module.

2. The method of claim 1, wherein selecting a pattern comprises:
    scanning each memory chip of each memory module during a scanning operation of the memory modules in a non-repetitive sequence.

3. The method of claim 1, further comprising:
    selecting and scanning a memory chip of each of the memory modules for errors in a non-linear order, and successively scanning remaining memory chips of a memory module when errors are found in the scanned memory chip of a respective memory module prior to scanning a memory chip of a next memory module.

4. The method of claim 1, wherein scanning a memory chip of a memory module for errors based upon the selected pattern comprises:
    selecting and scanning a first memory chip of a memory module for errors; and
    successively scanning remaining memory chips of the respective memory module when an error is found in the first memory chip of the respective memory module, and scanning a first memory chip of the other memory module, when no errors are found in the scanned first memory chip of the respective memory module.

5. The method of claim 1, wherein the memory modules are arranged in plurality of columns, and the pattern comprises scanning the memory modules diagonally or vertically across each column.

6. The method of claim 1, wherein scanning a memory chip of a memory module comprises:
    scanning a memory chip at a non-sequential memory location of the memory module for errors, and scanning the remaining memory chips of the respective memory module when an error is found at the scanned memory chip at the non-sequential memory location of the respective memory module.

7. The method of claim 6, wherein scanning a memory chip of another memory module comprises:
    scanning a memory chip at a non-sequential memory location of the other memory module for errors when no errors are found at the memory chip at the non-sequential memory location of the respective memory module.

8. The method of claim 7, wherein the non-sequential memory location of the scanned memory chip of the memory module and the scanned memory chip of the other memory module are a same non-sequential memory location.

9. The method of claim 1, further comprising:
    creating a queue and placing a memory module in the queue to be scanned first when an error is found at a memory chip of the memory module.

10. The method of claim 1, further comprising:
    performing testing on a memory module having errors for a predetermined time period, or replacing the memory module.

11. A computer program product comprising a non-transitory computer useable medium including a computer readable program, wherein the computer readable program when executed on a computer causes the computer to implement a method, the method comprising:
    selecting a pattern that correlates with physical structures for scanning memory chips of a plurality of memory modules for errors;
    scanning a memory chip of a memory module for errors based upon the selected pattern; and
    successively scanning remaining memory chips of the respective memory module for errors when an error is found in the scanned memory chip, and scanning a memory chip of another memory module when an error is not found in the scanned memory chip of the memory module.

12. The computer program product of claim 11, wherein selecting a pattern comprises:
    scanning each memory chip of each memory module during a scanning operation of the memory modules in a non-repetitive sequence.

13. The computer program product of claim 11, wherein the method further comprises:
    selecting and scanning a memory chip of each of the memory modules for errors in a non-linear order, and successively scanning remaining memory chips of a respective memory module when errors are found in the memory chip of the respective memory module prior to scanning a memory chip of a next memory module.

14. The computer program product of claim 11, wherein scanning a memory chip of a memory module for errors based upon the selected pattern comprises:
    selecting and scanning a first memory chip of a memory module for errors; and
    successively scanning remaining memory chips of the respective memory module when an error is found in the first memory chip of the respective memory module, and scanning a first memory chip of the other memory module, when no errors are found in the scanned first memory chip of the respective memory module.

15. The computer program product of claim 11, wherein the memory modules are arranged in plurality of columns, and the pattern comprises scanning the memory modules diagonally or vertically across each column.

16. The computer program product of claim 11, wherein scanning a memory chip of a memory module comprises:
    scanning a memory chip at a non-sequential memory location of the memory module for errors, and scanning the remaining memory chips of the respective memory module when an error is found at the memory chip at the non-sequential memory location of the respective memory module.

17. The computer program product of claim 16, wherein scanning a memory chip of another memory module comprises:
    scanning a memory chip at a non-sequential memory location of the other memory module for errors when no errors are found at the scanned memory chip at the non-sequential memory location of the respective memory module.

18. The computer program product of claim 17, wherein the scanned memory chip at the non-sequential memory location of the memory module and the scanned memory chip at the non-sequential memory location of the other memory module are a same non-sequential memory location.

19. The computer program product of claim 11, wherein the method further comprises:

creating a queue and placing a memory module in the queue to be scanned first when an error is found at a scanned memory chip of the memory module.

20. The computer program product of claim 11, wherein the method further comprises:

performing testing on a memory module having errors, for a predetermined time period, or replacing the memory module.

* * * * *